United States Patent
Volrath et al.

(10) Patent No.: US 7,872,902 B2
(45) Date of Patent: Jan. 18, 2011

(54) INTEGRATED CIRCUIT WITH BIT LINES POSITIONED IN DIFFERENT PLANES

(75) Inventors: Joerg Volrath, Olching (DE); Marcin Gnat, Mering (DE)

(73) Assignee: Qimonda AG, Munich (DE)

( * ) Notice: Subject to any disclaimer, the term of this patent is extended or adjusted under 35 U.S.C. 154(b) by 178 days.

(21) Appl. No.: 12/193,267

(22) Filed: Aug. 18, 2008

(65) Prior Publication Data

US 2010/0039845 A1 Feb. 18, 2010

(51) Int. Cl.
*G11C 11/24* (2006.01)

(52) U.S. Cl. .................. 365/149; 365/150; 365/185.13; 365/205

(58) Field of Classification Search .................. 365/149, 365/205, 51, 150, 185.13
See application file for complete search history.

(56) References Cited

U.S. PATENT DOCUMENTS

| | | | |
|---|---|---|---|
| 5,400,342 A * | 3/1995 | Matsumura et al. | 714/719 |
| 5,430,678 A * | 7/1995 | Tomita et al. | 365/200 |
| 6,304,479 B1 | 10/2001 | Vollrath et al. | |
| 6,400,621 B2 * | 6/2002 | Hidaka et al. | 365/200 |
| 6,967,370 B2 | 11/2005 | Schroder et al. | |
| 7,376,026 B2 | 5/2008 | Vollrath et al. | |
| 2007/0211509 A1 | 9/2007 | Vollrath | |

* cited by examiner

*Primary Examiner*—Pho M Luu
(74) *Attorney, Agent, or Firm*—Dicke, Billig & Czaja, PLLC (57) ABSTRACT

An integrated circuit includes a memory cell array including a plurality of memory cells. A first plurality of bit lines is positioned in a first plane. The first plurality of bit lines is electrically coupled to a first set of the memory cells. A second plurality of bit lines is positioned in a second plane that is different than the first plane. The second plurality of bit lines is electrically coupled to a second set of the memory cells.

20 Claims, 7 Drawing Sheets

INTEGRATED CIRCUIT WITH BIT LINES POSITIONED IN DIFFERENT PLANES

BACKGROUND

Integrated semiconductor memories, such as Dynamic Random Access Memories (DRAMs), have a multiplicity of memory cells that are arranged in a memory cell array and that are connected to word lines and bit lines. The bit lines are connected to the memory cells to read and write data. In the case of a DRAM, the memory cells each typically have a storage capacitor and a selection transistor. Information items stored in the storage capacitors of the memory cells are read out by activation of the word lines and bit lines. The electrical potential of two bit lines is detected by a sense amplifier in order to identify a storage state.

Since many cells in a DRAM are connected in parallel to the same line, considerable amount of energy and time is needed to bring the signal reliably to each corner of the array. One of the biggest factors influencing the signal is the bit line to bit line (BL-BL) capacitance. Such parasitic effects are conventionally compensated for by higher operating voltages and correspondingly higher quantities of charge. However, this increases the current consumption, the heat supply and the space requirement of the integrated semiconductor circuit per memory cell. Other solutions are also used to decrease BL-BL capacitance, such as the use of high-k dielectric materials between bit lines, the use of a dummy bit line between two active bit lines, and the use of larger bit line spacing. Disadvantages of these solutions include increased cost and the need for more horizontal space on the chip, thus resulting in larger chip size. The impetus for higher density devices has made the elimination of cross-talk or cross-coupling between bit lines an even more challenging task.

SUMMARY

One embodiment provides an integrated circuit that includes a memory cell array including a plurality of memory cells. A first plurality of bit lines is positioned in a first plane. The first plurality of bit lines is electrically coupled to a first set of the memory cells. A second plurality of bit lines is positioned in a second plane that is different than the first plane. The second plurality of bit lines is electrically coupled to a second set of the memory cells.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
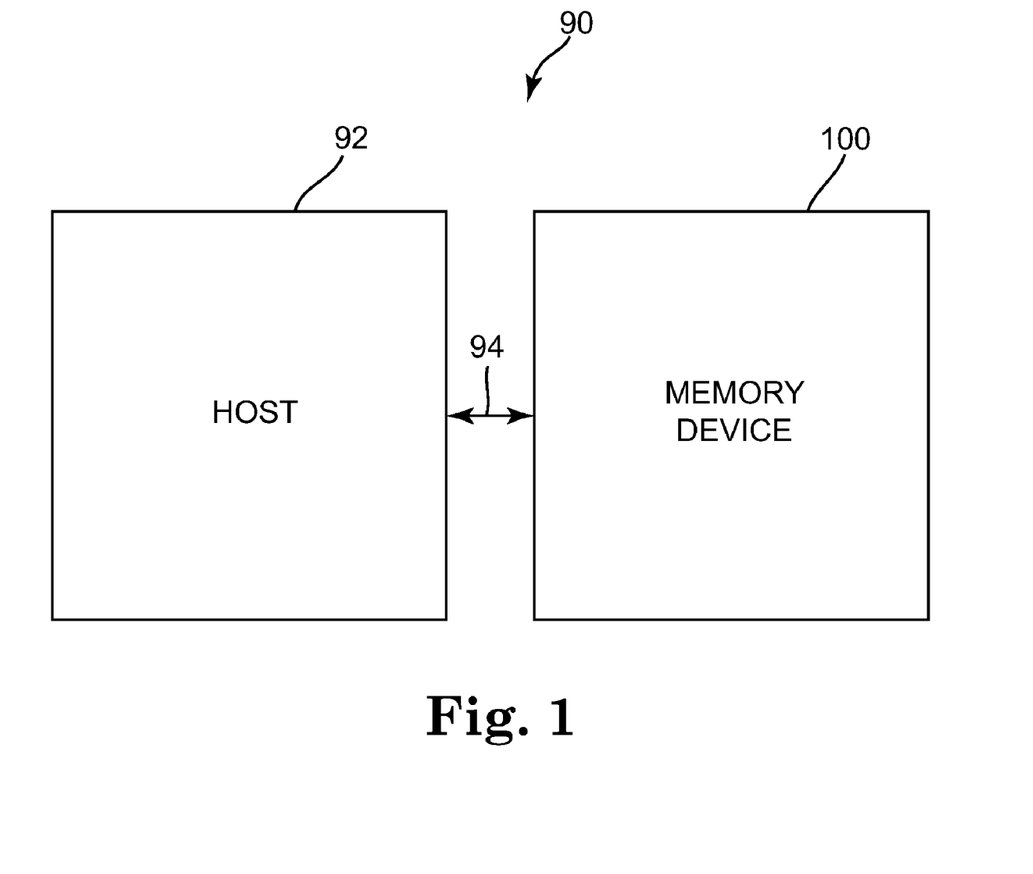
FIG. 1 is a block diagram illustrating a system with a memory device according to one embodiment.

FIG. 1 is a block diagram illustrating a system 90 according to one embodiment. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92.

Figure 2:
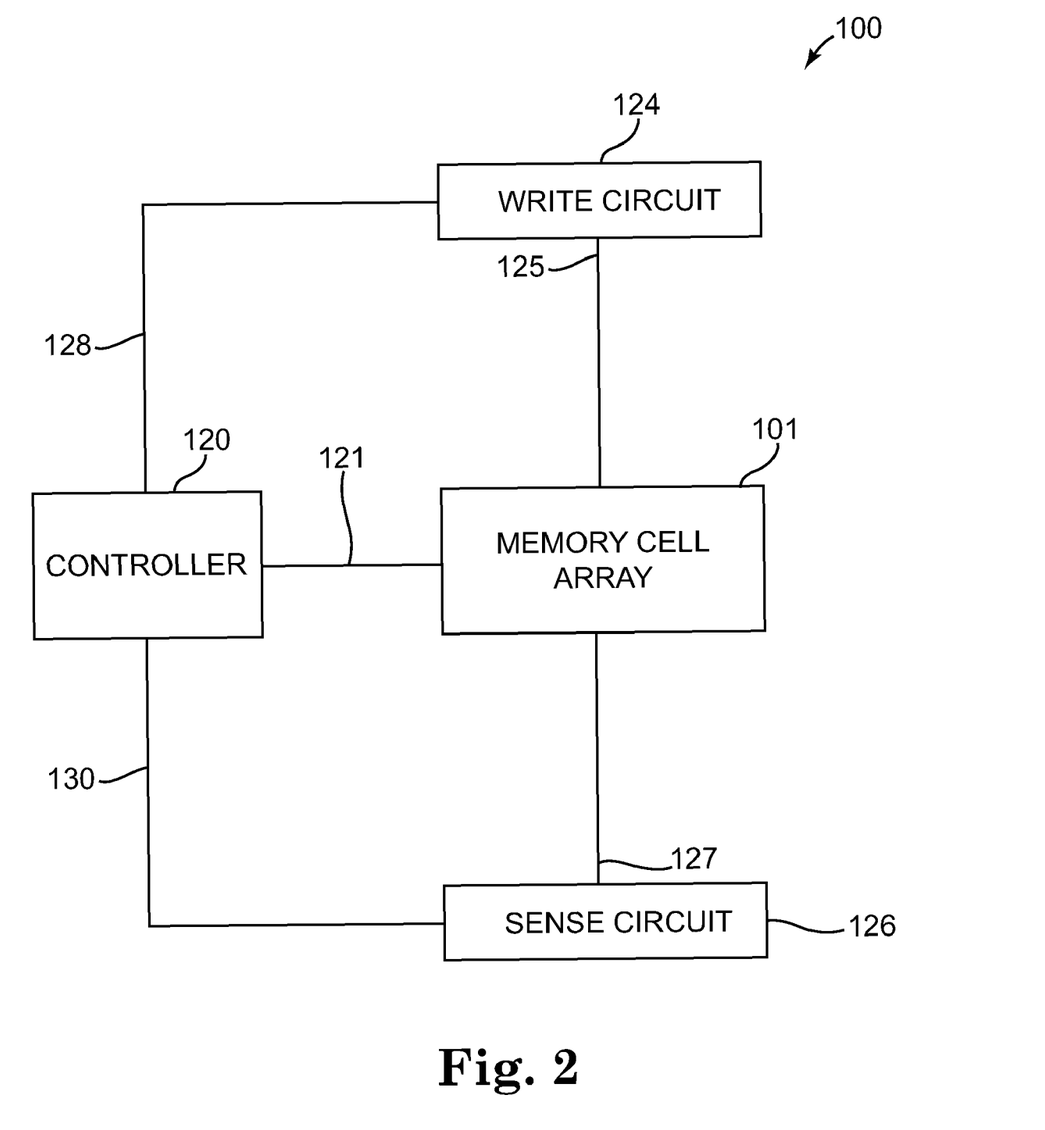
FIG. 2 is a diagram illustrating a memory device according to one embodiment.

FIG. 2 is a diagram illustrating a memory device 100 according to one embodiment. In one embodiment, memory device 100 is an integrated circuit or part of an integrated circuit. In one embodiment, memory device 100 is a dynamic random access memory (DRAM) semiconductor memory. Memory device 100 includes a write circuit 124, a controller 120, a memory cell array 101, and a sense circuit 126.

As used herein, the term "electrically coupled" is not meant to mean that the elements must be directly coupled together and intervening elements may be provided between the "electrically coupled" elements.

Memory cell array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130.

Controller 120 includes a microprocessor, microcontroller, or other suitable logic circuitry for controlling the operation of memory device 100. Controller 120 controls read and write operations of memory device 100 including the application of control and data signals to memory cell array 101 through write circuit 124 and sense circuit 126.

Figure 3:
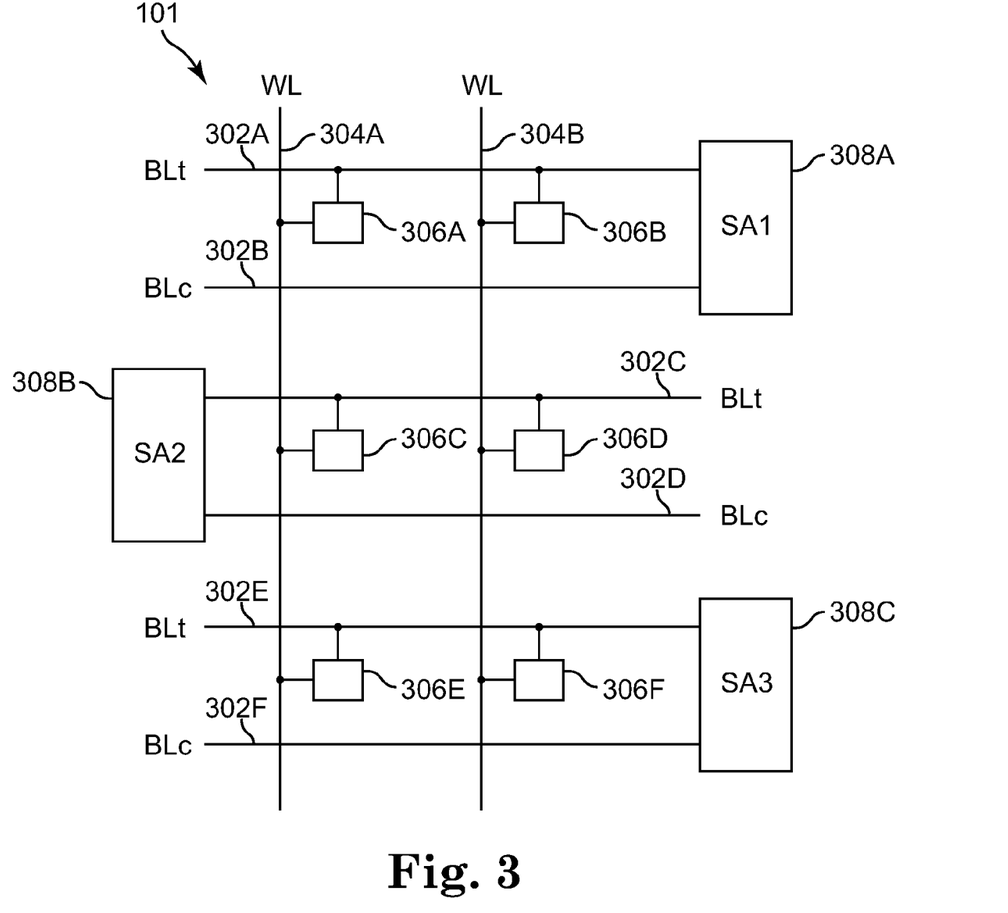
FIG. 3 is a diagram illustrating a memory cell array according to one embodiment.

FIG. 3 is a diagram illustrating a memory cell array 101 according to one embodiment. Memory cell array 101 includes a plurality of memory cells 306A-306F (collectively referred to as memory cells 306), a plurality of bit lines (BLs) 302A-302F (collectively referred to as bit lines 302), a plurality of word lines (WLs) 304A-304B (collectively referred to as word lines 304), and a plurality of sense amplifiers (SA) 308A-308C. The memory cells 306 are arranged in matrix form along the bit lines 302 and word lines 304.

Each memory cell 306 is electrically coupled to a word line 304 and a bit line 302. Memory cell 306A is electrically coupled to bit line 302A and word line 304A. Memory cell 306B is electrically coupled to bit line 302A and word line 304B. Memory cell 306C is electrically coupled to bit line 302C and word line 304A. Memory cell 306D is electrically coupled to bit line 302C and word line 304B. Memory cell 306E is electrically coupled to bit line 302E and word line 304A. Memory cell 306F is electrically coupled to bit line 302E and word line 304B.

In the illustrated embodiment, the bit lines 302 include a plurality of true bit lines (BLt) 302A, 302C, and 302E, and a plurality of complement bit lines (BLc) 302B, 302D, and 302F. True bit line 302A and complement bit line 302B represent a bit line pair, which is electrically coupled to sense amplifier 308A located on a right-hand side of the memory array 101. During the read-out of memory cell 306A or 306B, the sense amplifier 308A generates an output signal in accordance with the memory state stored in the memory cell. True bit line 302C and complement bit line 302D represent a bit line pair, which is electrically coupled to sense amplifier 308B located on a left-hand side of the memory array 101. During the read-out of memory cell 306C or 306D, the sense amplifier 308B generates an output signal in accordance with the memory state stored in the memory cell. True bit line 302E and complement bit line 302F represent a bit line pair, which is electrically coupled to sense amplifier 308C located on a right-hand side of the memory array 101. During the read-out of memory cell 306E or 306F, the sense amplifier 308C generates an output signal in accordance with the memory state stored in the memory cell.

In one embodiment, in addition to the sense amplifiers 308A and 308C, further sense amplifiers (not shown) are arranged on the right-hand side of the memory array 101 and electrically coupled to associated bit line pairs. Situated between the bit line pairs that are connected to sense amplifiers on the right-hand side of the memory array 101 are further bit line pairs that are electrically coupled to further sense amplifiers located on the left-hand side of the memory array 101.

Figure 4:
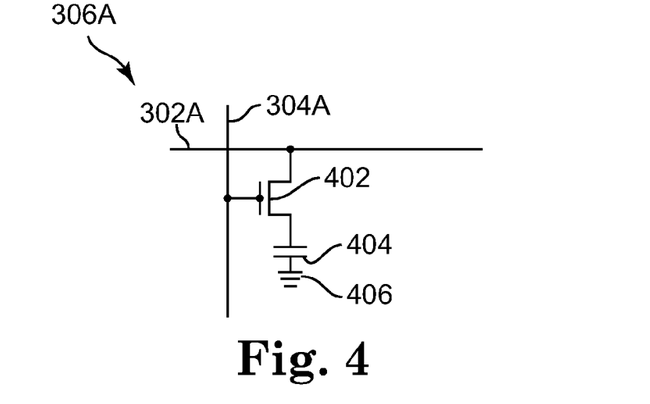
FIG. 4 is a diagram illustrating a memory cell according to one embodiment.

FIG. 4 is a diagram illustrating a memory cell 306A according to one embodiment. Memory cell 306A includes a selection transistor 402 and a storage capacitor 404. In the illustrated embodiment, selection transistor 402 is a field effect transistor (FET). One capacitor plate of the storage capacitor 404 is electrically coupled to bit line 302A via the selection transistor 402, and the other capacitor plate is electrically coupled to a plate voltage, such as a ground potential 406. The gate of selection transistor 402 is electrically coupled to word line 304A. The selection transistor 402 is enabled via the word line 304A, which permits conduction to charge or discharge the storage capacitor 404. In one embodiment, memory cells 306B-306F (FIG. 3) are configured in the same manner as memory cell 306A.

Parasitic coupling capacitances (e.g., bit line to bit line capacitances) may be present between the bit line pairs of a memory array, and between adjacent bit line pairs. The parasitic coupling capacitances influence the potential state on the bit lines of a bit line pair during a read access. One embodiment compensates for the bit line to bit line capacitances by using a multi-level bit line architecture, as described in further detail below with reference to FIGS. 5-8.

Figure 5A:
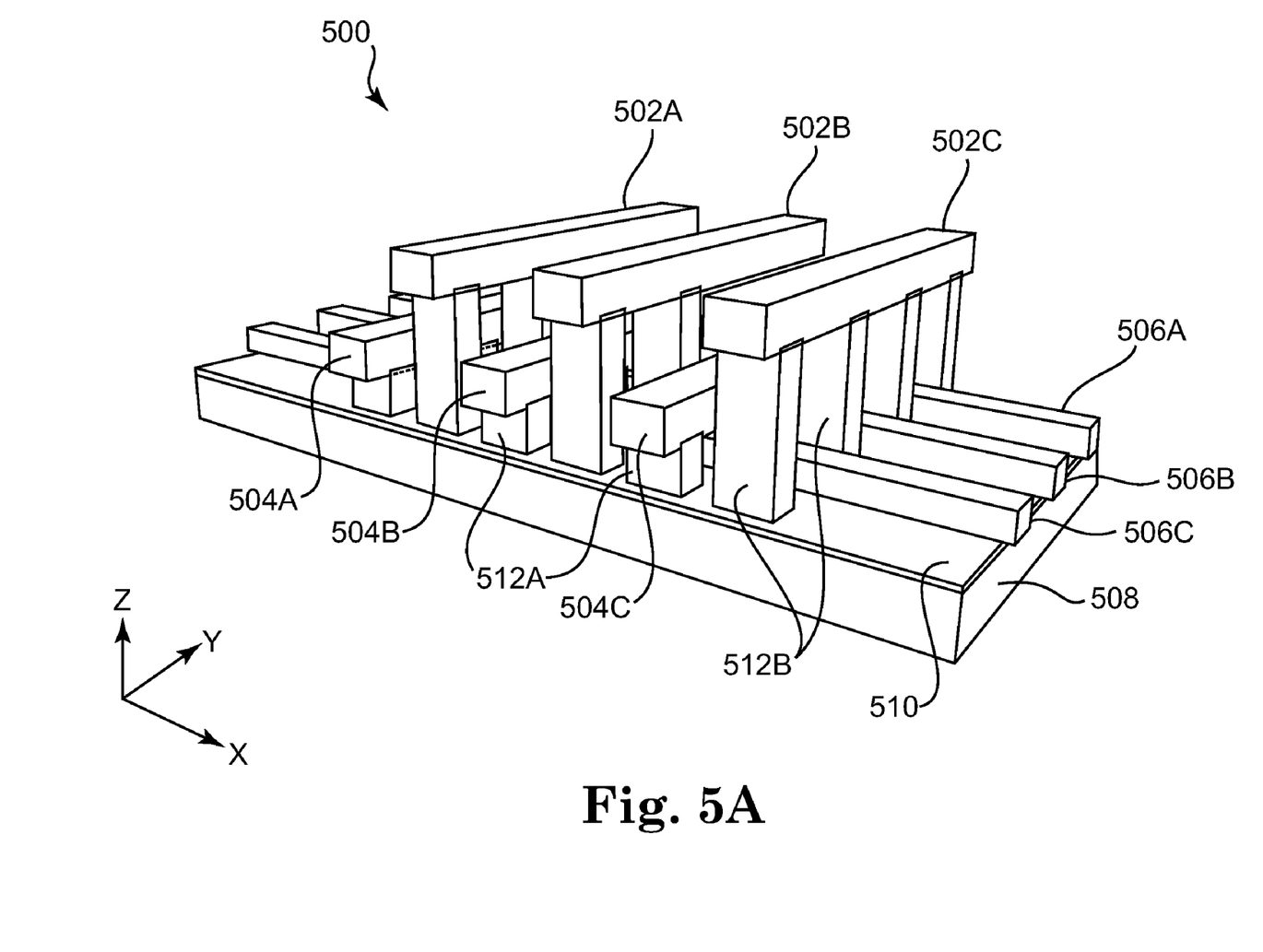
FIG. 5A is a diagram illustrating a perspective view of a memory cell array with multi-level bit lines according to one embodiment.
Figure 5B:
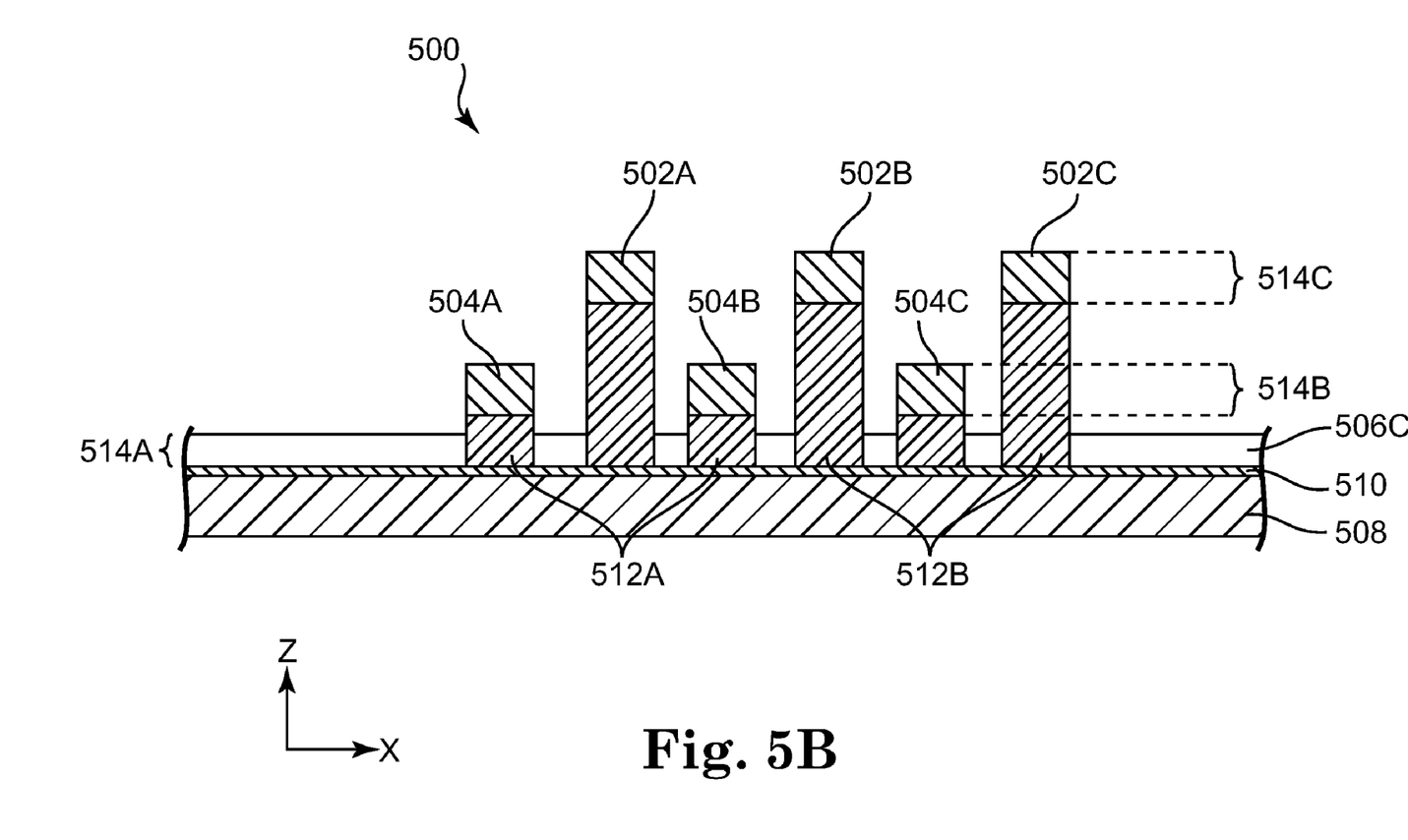
FIG. 5B is a diagram illustrating a cross-sectional view of the memory cell array shown in FIG. 5A according to one embodiment.
Figure 5C:
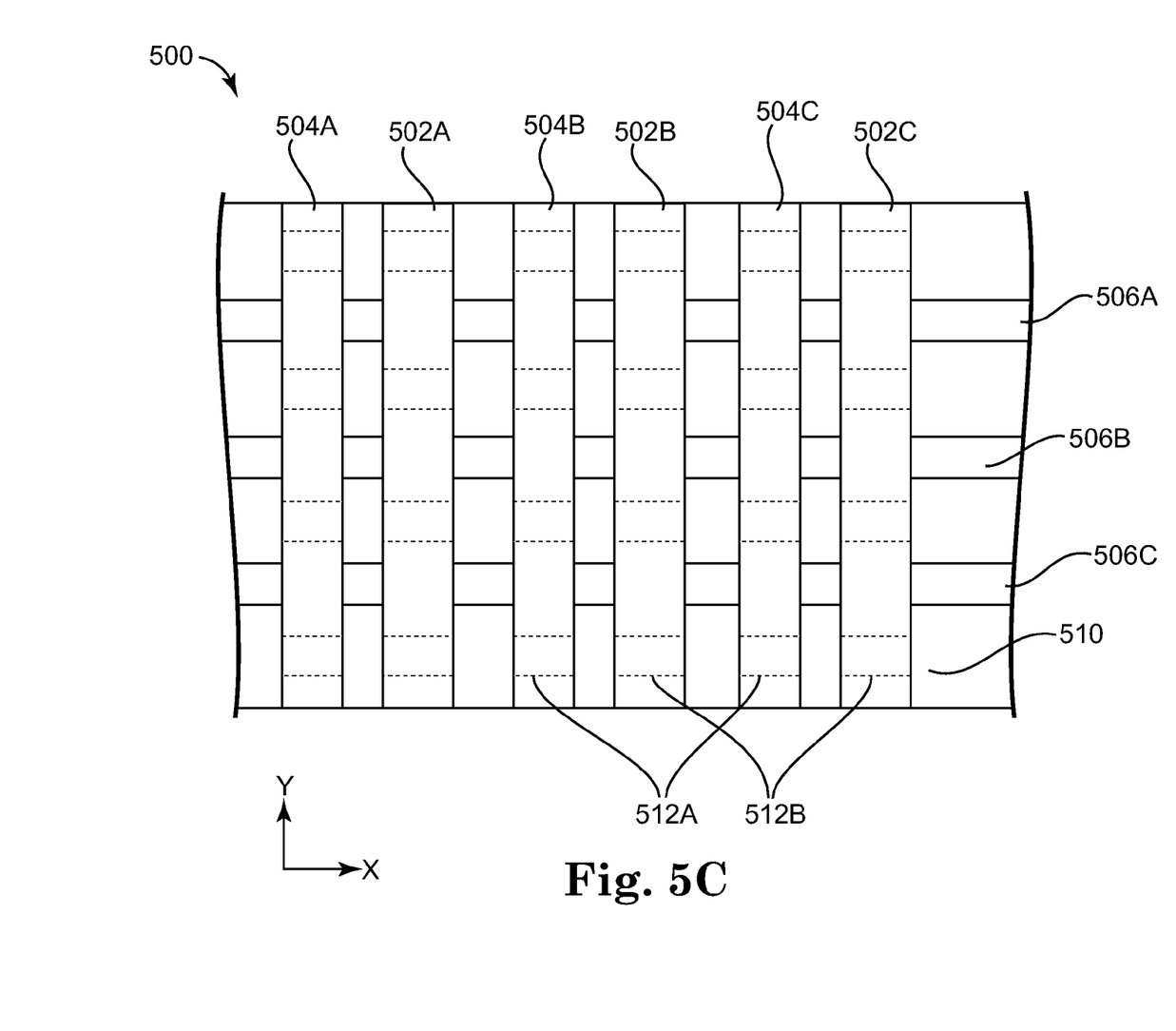
FIG. 5C is a diagram illustrating a top view of the memory cell array shown in FIG. 5A according to one embodiment.

FIG. 5A is a diagram illustrating a perspective view of a memory cell array 500 with multi-level bit lines according to one embodiment. FIG. 5B is a diagram illustrating a cross-sectional view of the memory cell array 500 shown in FIG. 5A according to one embodiment. FIG. 5C is a diagram illustrating a top view of the memory cell array 500 shown in FIG. 5A according to one embodiment. As shown in FIGS. 5A-5C, memory cell array 500 includes a first plurality of bit lines 502A-502C (collectively referred to as bit lines 502), a second plurality of bit lines 504A-504C (collectively referred to as bit lines 504), a plurality of word lines 506A-506C (collectively referred to as word lines 506), a semiconductor substrate 508, a gate oxide layer 510, and a plurality of electrical contact structures 512A and 512B (collectively referred to as electrical contact structures 512).

In one embodiment, semiconductor substrate 508 is a silicon substrate that includes a plurality of memory cells formed therein, such as the memory cell 306A shown in FIG. 4, with each memory cell including a storage capacitor and a selection transistor. In one embodiment, the storage capacitors are trench capacitors formed in the semiconductor substrate 508.

The gate oxide layer 510 is formed on a top surface of the substrate 508. The word lines 506 are formed on the gate oxide layer 510. The bit lines 502 and 504 are included for reading and writing data to and from the memory cells in semiconductor substrate 508. Each bit line 502 in the first plurality is positioned between two adjacent bit lines 504 in the second plurality, and each bit line 504 in the second plurality is positioned between two adjacent bit lines 502 in the first plurality.

A set of X-Y-Z axes are also shown in FIGS. 5A-5C. The X and Y axes represent lateral directions and form a plane that is parallel to the plane of the substrate 508. The Z-axis represents a vertical direction that is perpendicular to the plane of the substrate 508. The first plurality of bit lines 502 run parallel to the second plurality of bit lines 504 along the Y-axis. The word lines 506 run along the X-axis, which is perpendicular to the first plurality of bit lines 502 and the second plurality of bit lines 504. The bit lines 502 and 504 are arranged on the semiconductor substrate 508 at a greater vertical distance from the semiconductor substrate 508 (i.e., along the Z-axis) than the word lines 506. The first plurality of bit lines 502 is arranged on the semiconductor substrate 508 at a greater vertical distance from the semiconductor substrate 508 (i.e., along the Z-axis) than the second plurality of bit lines 504.

The first plurality of bit lines 502, the second plurality of bit lines 504, and the word lines 506, are each arranged in a different lateral plane of array 500, with each plane being parallel to the plane of the substrate 508, and each plane having a different vertical height or being at a different vertical distance from the substrate 508. The word lines 506 are arranged in a first lateral plane 514A (FIG. 5B) that is closer to the top surface of the substrate 508 than the bit lines 502 and the bit lines 504. The bit lines 504 are arranged in a second lateral plane 514B that is farther away from the top surface of the substrate 508 than the word lines 506, and closer to the top surface of the substrate 508 than the bit lines 502. The bit lines 502 are arranged in a third lateral plane 514C that is farther away from the top surface of the substrate 508 than the word lines 506 and the bit lines 504.

In one embodiment, the entire length of each bit line in the first plurality of bit lines 502 is positioned in the plane 514C, and the entire length of each bit line in the second plurality of bit lines 504 is positioned in the plane 514B. In another embodiment, substantially the entire length of each bit line in the first plurality of bit lines 502 is positioned in the plane 514C, and substantially the entire length of each bit line in the second plurality of bit lines 504 is positioned in the plane 514B. In another embodiment, over ninety percent of the entire length of each bit line in the first plurality of bit lines 502 is positioned in the plane 514C, and over ninety percent of the entire length of each bit line in the second plurality of bit lines 504 is positioned in the plane 514B.

The bit lines 504 are electrically coupled to memory cells within the substrate 508 via contact structures 512A, and the bit lines 502 are electrically coupled to memory cells within the substrate 508 via contact structures 512B. Each contact structure 512A or 512B corresponds to and is electrically coupled to one memory cell in substrate 508. The contact structures 512A and 512B extend vertically upward (i.e., along the Z-axis) from the substrate 508. The contact structures 512A have a different height than the contact structures 512B. The contact structures 512B are arranged on the semiconductor substrate 508 and extend a greater distance from the semiconductor substrate 508 (i.e., along the Z-axis) than the contact structures 512A.

In one embodiment, array 500 uses an open bit line architecture, with the two bit lines for each sense amplifier arranged on opposite sides of the sense amplifier, such that the two bit lines cross different word lines. In another embodiment, array 500 uses a folded bit line architecture, with the two bit lines for each sense amplifier arranged on the same side of the sense amplifier such that the two bit lines cross the same word lines. In one embodiment, adjacent bit lines from different levels or planes (e.g., bit lines 502A and 504A) are electrically coupled to the same sense amplifier. In another embodiment, adjacent bit lines from the same level (e.g., bit lines 502A and 502B) are electrically coupled to the same sense amplifier.

One embodiment of array 500 provides a reduction in bit line to bit line capacitance by increasing the distance between bit lines in the vertical direction (i.e., along the Z-axis). This increase in distance between adjacent bit lines in the vertical direction according to one embodiment results in smaller bit line to bit line capacitance, without increasing the size of the integrated circuit, and without the need for costly high-k dielectric materials. The increased overall distance between adjacent bit lines according to one embodiment reduces bit line to bit line capacitance without an increase in lateral spacing between adjacent bit lines, and even provides a reduction in lateral spacing in one embodiment. One embodiment allows usage of folded bit lines at 6F2 cell size (where F corresponds to the smallest lithographically produced feature size in the respective semiconductor circuit). In one embodiment, the memory cell size in array 500 is smaller than 4F2. In one embodiment, bit lines 504 are positioned a distance, F, from the substrate 508, and bit lines 502 are positioned a distance, 3F, from the substrate 508, where F again corresponds to the smallest lithographically produced feature size in array 500.

In the illustrated embodiment, the word lines 506 are positioned under the bit lines 502 and 504. In another embodiment, such as in a configuration that uses stacked capacitors, the word lines 506 are placed above the bit lines 502 and 504. The techniques described herein can also be applied to buried bit lines.

Figure 6:
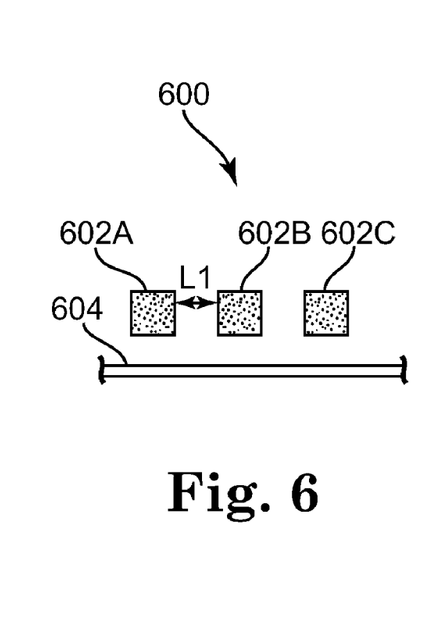
FIG. 6 is a diagram illustrating a cross-sectional view of a single-level bit line architecture.

FIG. 6 is a diagram illustrating a cross-sectional view of a single-level bit line architecture 600. All of the bit lines 602A-602C (collectively referred to as bit lines 602) in the array are arranged on the same level or plane, and are each at the same vertical distance from the substrate 604. The lateral distance between adjacent bit lines in the illustrated embodiment is represented by L1. The bit line to bit line capacitance can be determined from the following Equation I:

$$C_{BLBL} = \in (\text{Height} * \text{Length})/L \quad \text{Equation I}$$

Where:
  $C_{BLBL}$=bit line to bit line capacitance;
  $\in$=dielectric constant for the material between the bit lines;
  Height=height of bit line;
  Length=length of bit line; and
  L=distance between bit lines.

As shown by Equation I, increasing the distance L (which corresponds to L1 in FIG. 6), results in a decrease in the bit line to bit line capacitance.

Figure 7:
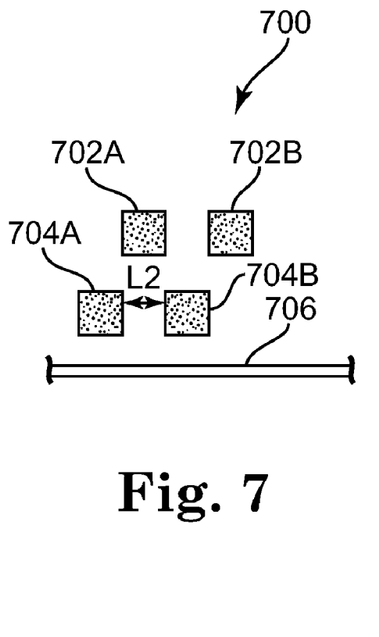
FIG. 7 is a diagram illustrating a cross-sectional view of a two-level bit line architecture according to one embodiment.

FIG. 7 is a diagram illustrating a cross-sectional view of a two-level bit line architecture 700 according to one embodiment. In the illustrated embodiment, the bit lines 702A and 702B (collectively referred to as bit lines 702) in the array are arranged on a higher level or plane than the bit lines 704A and 704B (collectively referred to as bit lines 704), and are each at a higher vertical distance from the substrate 706 than the bit lines 704. The distance between adjacent bit lines 702 or between adjacent bit lines 704 in the illustrated embodiment is represented by L2. In the illustrated embodiment, L2 is equal to L1 (FIG. 6), so bit lines 702 and 704 have the same bit line to bit line capacitance as the bit lines 602 shown in FIG. 6, but the two-level architecture of bit lines 702 and 704 provides an overall denser pitch or lateral spacing between bit lines than the bit lines 602.

Figure 8:
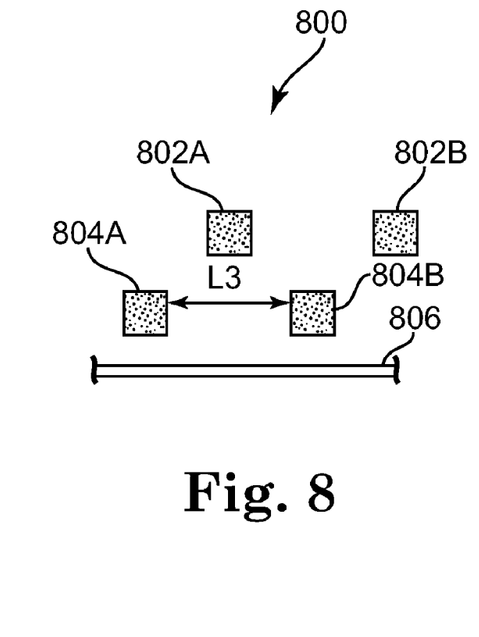
FIG. 8 is a diagram illustrating a cross-sectional view of a two-level bit line architecture according to another embodiment.

FIG. 8 is a diagram illustrating a cross-sectional view of a two-level bit line architecture 800 according to another embodiment. In the illustrated embodiment, the bit lines 802A and 802B (collectively referred to as bit lines 802) in the array are arranged on a higher level or plane than the bit lines 804A and 804B (collectively referred to as bit lines 804), and are each at a higher vertical distance from the substrate 806 than the bit lines 804. The distance between adjacent bit lines 802 or between adjacent bit lines 804 in the illustrated embodiment is represented by L3. In the illustrated embodiment, L3 is larger than L1, so bit lines 802 and 804 each have a lower bit line to bit line capacitance than the bit lines 602 shown in FIG. 6, and the bit lines 802 and 804 have an overall pitch that is the same as the pitch of the bit lines 602.

One embodiment provides a bit line architecture for memory arrays, which significantly reduces stray capacitances between bit lines. When a signal is read out of a memory cell, the stray capacitance between bit lines reduces the signal. One embodiment provides an architecture to eliminate or substantially reduce the stray capacitances and to improve the signal quality during sensing. The semiconductor circuit formed according to one embodiment thus enables a more reliable read-out of digital information items stored in the storage capacitors and the reliable evaluation of the information items as either digital zero or digital one.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
   a memory cell array comprising a plurality of memory cells;
   a first plurality of bit lines positioned in a first plane, the first plurality of bit lines electrically coupled to a first set of the memory cells;
   a second plurality of bit lines positioned in a second plane that is different than the first plane, the second plurality of bit lines electrically coupled to a second set of the memory cells; and
   wherein the first plane and the second plane are positioned at different vertical heights in the integrated circuit.

2. The integrated circuit of claim 1, wherein each bit line in the first plurality of bit lines is positioned between two bit lines in the second plurality of bit lines, and wherein each bit line in the second plurality of bit lines is positioned between two bit lines in the first plurality of bit lines.

3. The integrated circuit of claim 1, and further comprising:
   a plurality of word lines positioned in a third plane that is different than the first plane and the second plane, the plurality of word lines electrically coupled to the memory cells.

4. The integrated circuit of claim 1, and further comprising:
   a plurality of sense amplifiers, each sense amplifier electrically coupled to two of the bit lines.

5. The integrated circuit of claim 4, wherein each sense amplifier is electrically coupled to one bit line in the first plurality and one bit line in the second plurality.

6. The integrated circuit of claim 4, wherein each sense amplifier is electrically coupled to two bit lines in the first plurality or two bit lines in the second plurality.

7. The integrated circuit of claim 1, wherein the memory cell array comprises a folded bit line architecture.

8. The integrated circuit of claim 1, wherein the memory cell array comprises an open bit line architecture.

9. The integrated circuit of claim 1, wherein each memory cell includes a selection transistor and a storage capacitor.

10. The integrated circuit of claim 1, wherein the integrated circuit is a dynamic random access memory (DRAM).

11. The integrated circuit of claim 1, and further comprising:
    a first plurality of vertically extending electrical contact structures configured to electrically couple the first plurality of bit lines to the first set of memory cells;
    a second plurality of vertically extending electrical contact structures configured to electrically couple the second plurality of bit lines to the second set of memory cells; and
    wherein the first plurality of electrical contact structures each have a different height than the second plurality of electrical contact structures.

12. The integrated circuit of claim 1, wherein the first plurality of bit lines is arranged on a semiconductor substrate at a greater distance from the semiconductor substrate than the second plurality of bit lines and word lines of the integrated circuit, and wherein the second plurality of bit lines is arranged on the semiconductor substrate at a greater distance from the semiconductor substrate than the word lines.

13. The integrated circuit of claim 1, wherein substantially an entire length of each bit line in the first plurality of bit lines is positioned in the first plane, and substantially an entire length of each bit line in the second plurality of bit lines is positioned in the second plane.

14. The integrated circuit of claim 1, and further comprising:
    a plurality of word lines electrically coupled to the memory cells and configured to enable access to the memory cells when the word lines are enabled; and
    wherein the first and second pluralities of bit lines are configured for reading and writing data to and from the memory cells when the word lines are enabled.

15. An integrated circuit, comprising:
    a substrate including a memory cell array having a plurality of memory cells;
    a plurality of word lines positioned in a lateral plane on the substrate and electrically coupled to the memory cells;
    a first plurality of bit lines positioned a first vertical distance above the word lines and electrically coupled to a first set of the memory cells; and
    a second plurality of bit lines positioned a second vertical distance above the word lines and electrically coupled to a second set of the memory cells, wherein the second vertical distance is different than the first vertical distance.

16. The integrated circuit of claim 15, wherein each bit line in the first plurality of bit lines is positioned between two bit lines in the second plurality of bit lines, and wherein each bit line in the second plurality of bit lines is positioned between two bit lines in the first plurality of bit lines.

17. The integrated circuit of claim 15, and further comprising:
    a plurality of sense amplifiers, each sense amplifier electrically coupled to two of the bit lines.

18. The integrated circuit of claim 15, and further comprising:
    a first plurality of vertically extending electrical contact structures configured to electrically couple the first plurality of bit lines to the first set of memory cells;
    a second plurality of vertically extending electrical contact structures configured to electrically couple the second plurality of bit lines to the second set of memory cells; and
    wherein the first plurality of electrical contact structures have a different height than the second plurality of electrical contact structures.

19. The integrated circuit of claim 15, wherein substantially an entire length of each bit line in the first plurality of bit lines is positioned at the first vertical distance, and substantially an entire length of each bit line in the second plurality of bit lines is positioned at the second vertical distance.

20. A system comprising:
    a host; and
    a memory device communicatively coupled to the host, the memory device comprising:
    an array of memory cells;
    a plurality of word lines positioned in a first lateral plane, the plurality of word lines electrically coupled to the memory cells;
    a first plurality of bit lines positioned in a second lateral plane, the first plurality of bit lines electrically coupled to a first set of the memory cells;
    a second plurality of bit lines positioned in a third lateral plane, the second plurality of bit lines electrically coupled to a second set of the memory cells; and
    wherein the first plane, the second plane, and the third plane are each positioned at different vertical heights in the memory device.

* * * * *